(12) United States Patent
Kobayashi et al.

(10) Patent No.: US 10,304,954 B2
(45) Date of Patent: May 28, 2019

(54) SEMICONDUCTOR DEVICE AND METHOD OF MANUFACTURING SEMICONDUCTOR DEVICE

(71) Applicant: FUJI ELECTRIC CO., LTD., Kawasaki-shi, Kanagawa (JP)

(72) Inventors: Yusuke Kobayashi, Tsukuba (JP); Shinsuke Harada, Tsukuba (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/800,577

(22) Filed: Nov. 1, 2017

(65) Prior Publication Data

US 2018/0182886 A1    Jun. 28, 2018

(30) Foreign Application Priority Data

Dec. 28, 2016   (JP) ................................ 2016-256900

(51) Int. Cl.
*H01L 29/78* (2006.01)
*H01L 21/04* (2006.01)
(Continued)

(52) U.S. Cl.
CPC .......... *H01L 29/7813* (2013.01); *H01L 21/04* (2013.01); *H01L 21/0465* (2013.01); *H01L 21/26586* (2013.01); *H01L 29/0878* (2013.01); *H01L 29/1095* (2013.01); *H01L 29/165* (2013.01); *H01L 29/1608* (2013.01); *H01L 29/41766* (2013.01); *H01L 29/42376* (2013.01);
(Continued)

(58) Field of Classification Search
CPC .................................................. H01L 29/7813
See application file for complete search history.

(56) References Cited

U.S. PATENT DOCUMENTS

| | | | |
|---|---|---|---|
| 2015/0214355 A1* | 7/2015 | Nakano | H01L 29/71766 257/330 |
| 2018/0175147 A1* | 6/2018 | Ohse | H01L 29/7395 |
| 2018/0182885 A1* | 6/2018 | Kobayashi | H01L 29/4236 |

FOREIGN PATENT DOCUMENTS

JP    H07-161983 A    6/1995

OTHER PUBLICATIONS

Y. Nakano et al., "690V, 1.00 mΩcm² 4H—SiC Double-Trench MOSFETs", Materials Science Forum, (Switzerland), Trans Tech Publications Inc., vols. 717-720, pp. 1069-1072, May 2012.

* cited by examiner

*Primary Examiner* — Mounir S Amer
(74) *Attorney, Agent, or Firm* — Rabin & Berdo, P.C.

(57) ABSTRACT

A p-type base region is constituted by first to fifth p-type base regions. The first p-type base region is provided deeper than gate trenches. The second p⁺-type base region is provided along side walls of a contact trench. The fourth p⁺-type base region is provided along a bottom of the contact trench and is exposed at the bottom of the contact trench. The fifth p-type base region is in contact with the second and fourth p⁺-type base regions, which have an impurity concentration higher than that of the fifth p-type base region. The fifth p-type base region is provided along the bottom of the contact trench and deeper than the fourth p⁺-type base region. In the fifth p-type base region, the third p⁺⁺-type base region, which has an impurity concentration higher than that of the fifth p-type base region, is arranged.

10 Claims, 12 Drawing Sheets

(51) Int. Cl.
  *H01L 29/08*    (2006.01)
  *H01L 29/16*    (2006.01)
  *H01L 29/165*   (2006.01)
  *H01L 29/423*   (2006.01)
  *H01L 29/66*    (2006.01)
  *H01L 21/265*   (2006.01)
  *H01L 29/417*   (2006.01)
  *H01L 29/739*   (2006.01)
  *H01L 29/10*    (2006.01)

(52) U.S. Cl.
  CPC .... *H01L 29/66068* (2013.01); *H01L 29/7396* (2013.01); *H01L 29/7397* (2013.01); *H01L 29/7802* (2013.01)

SEMICONDUCTOR DEVICE AND METHOD OF MANUFACTURING SEMICONDUCTOR DEVICE

CROSS REFERENCE TO RELATED APPLICATIONS

This application is based upon and claims the benefit of priority of the prior Japanese Patent Application No. 2016-256900, filed on Dec. 28, 2016, the entire contents of which are incorporated herein by reference.

BACKGROUND OF THE INVENTION

1. Field of the Invention

Embodiments of the invention relate to a semiconductor device and a method of manufacturing a semiconductor device.

2. Description of the Related Art

Trench-gate type metal oxide semiconductor field effect transistors (MOSFETs) sustaining voltages of 400V, 600V, 1200V, 1700V, 3300V, 6500V or higher are commonly known power semiconductor devices. For example, trench-gate type MOSFETs that use silicon carbide (SiC) (hereinafter, SiC-MOSFETs) are employed in power converting equipment such as converters and inverters. There is demand for these power semiconductor devices to have low loss and high efficiency while at the same time satisfy required breakdown voltages. There is further demand for power semiconductor devices to suppress leak current in an OFF state.

A conventional trench-gate type SiC-MOSFET has been proposed in which a contact trench is provided between adjacent gate trenches (for example, refer to Japanese Laid-Open Patent Publication No. H07-161983 and Y. Nakano, et al, "690V, 1.00 mΩcm2 4H-SiC Double-Trench MOSFETs", Materials Science Forum, (Switzerland), Trans Tech Publications Inc., May 2012, Vols. 717-720, p. 1069-1072). A gate trench is a trench in which a gate electrode is embedded, via a gate insulating film. A contact trench is a trench in which a metal electrode (source electrode) is embedded, forming a contact (electrical contact portion) of the metal electrode and a semiconductor region exposed at an inner wall. By forming the contact between the metal electrode and the semiconductor region in the contact trench, electric field applied to the gate insulating film at a bottom of the gate trench is mitigated. A structure of a conventional trench-gate type SiC-MOSFET will be described. FIG. 12 is a ross-sectional view of a structure of an active region of a conventional trench-gate type SiC-MOSFET.

In the active region, which is responsible for current driving, the conventional trench-gate type SiC-MOSFET depicted in FIG. 12 includes a trench-gate type MOS gate (an insulated gate including a metal oxide film semiconductor) structure and a contact trench 108 on a front surface side of a semiconductor base (hereinafter, silicon carbide base) 110 containing silicon carbide. In particular, the silicon carbide base 110 is formed by forming by epitaxial growth, an n⁻-type silicon carbide layer that becomes an n⁻-type drift layer 102 (102a, 102b) on an n-type supporting substrate (hereinafter, n⁺-type silicon carbide substrate) that includes silicon carbide and becomes an n⁺-type drain layer 101. On a front surface (surface on the n⁻-type drift layer 102 side) side of the silicon carbide base 110, a MOS gate structure constituted by a p-type base region 103, n⁺-type source regions 104, gate trenches 105, a gate insulating films 106, and a gate electrodes 107 is provided.

To mitigate electric field applied to the gate insulating film 106 at a bottom 105a of the gate trench 105, between the adjacent gate trenches 105 (mesa portion), at least a portion of the p-type base region 103 is provided at a depth deeper than that of the gate trenches 105. To make the depth of said portion of the p-type base region 103 deeper than that of the gate trench 105, in the mesa portion, the contact trench 108 is provided at a depth deeper than that of the gate trench 105. The p-type base region 103 is provided so as to be exposed at an entire inner wall (a bottom 108a and side walls 108b) of the contact trench 108. The p-type base region 103 is in contact with a source electrode 111 (described later) at the entire inner wall of the contact trench 108. The p-type base region 103 is formed by an ion implantation method that enables variation of the impurity concentration to be suppressed and that enables formation using existing manufacturing equipment.

The n⁺-type source region 104 is selectively provided in the p-type base region 103 between the contact trench 108 and the gate trenches 105 adjacent thereto. The n⁺-type source region 104 is exposed at a base front surface and at the side walls 108b of the contact trench 108. The n⁺-type source region 104 and the p-type base region 103 exposed at the inner wall of the contact trench 108 are exposed in a contact hole 109a that penetrates an interlayer insulating film 109 in a depth direction. The source electrode 111 is embedded in the contact hole 109a and the contact trench 108, and is in contact with the p-type base region 103 and the n⁺-type source region 104. On a rear surface (surface on the n⁺-type drain layer 101 side) of the silicon carbide base 110, a drain electrode 112 is provided.

SUMMARY OF THE INVENTION

According to one aspect of the present invention, a semiconductor device includes a first semiconductor layer of a first conductivity type provided on a front surface of a semiconductor substrate of the first conductivity type, an impurity concentration of the first semiconductor layer is lower than that of the semiconductor substrate; a first trench provided in the first semiconductor layer; a gate electrode provided in the first trench via a gate insulating film; a second semiconductor layer of the first conductivity type facing the gate electrode across the gate insulating film provided on side walls of the first trench; a first semiconductor region of a second conductivity type provided between the first semiconductor layer and the second semiconductor layer, the first semiconductor region facing the gate electrode across the gate insulating film provided on the side walls of the first trench; a second trench provided between the first trench and an adjacent first trench; a second semiconductor region of the second conductivity type provided along side walls of the second trench and in contact with the first semiconductor region; a third semiconductor region of the second conductivity type selectively provided near a bottom corner portion of the second trench; a fourth semiconductor region of the second conductivity type provided along a bottom of the second trench and exposed at least at a portion of the bottom of the second trench; a fifth semiconductor region of the second conductivity type provided along the bottom of the second trench and deeper than the fourth semiconductor region, the fifth semiconductor region in contact with the second semiconductor region and the fourth semiconductor region; a first electrode embedded in the second trench; and a second electrode provided on a rear surface of the semiconductor substrate. An impurity concentration of the third semiconductor region is higher than an impurity concentration of the fifth semiconductor region. At least one third semiconductor region is arranged in the fifth semiconductor region.

According to another aspect of the present invention, a semiconductor device includes a first semiconductor layer of a first conductivity type provided on a front surface of a semiconductor substrate of the first conductivity type, an impurity concentration of the first semiconductor layer is lower than that of the semiconductor substrate; a first trench provided in the first semiconductor layer; a gate electrode provided in the first trench via a gate insulating film; a second semiconductor layer of the first conductivity type facing the gate electrode across the gate insulating film provided on side walls of the first trench; a first semiconductor region of a second conductivity type provided between the first semiconductor layer and the second semiconductor layer, the first semiconductor region facing the gate electrode across the gate insulating film provided on the side walls of the first trench; a second trench provided between the first trench and an adjacent first trench; a second semiconductor region of the second conductivity type provided along side walls of the second trench and in contact with the first semiconductor region; a third semiconductor region of the second conductivity type provided at a bottom corner portion of the second trench and exposed at the bottom corner portion of the second trench, the third semiconductor region in contact with the second semiconductor region; a fourth semiconductor region of the second conductivity type provided along a bottom of the second trench and exposed at the entire bottom of second trench, the fourth semiconductor region in contact with the third semiconductor region; a fifth semiconductor region of the second conductivity type provided along the bottom of the second trench and deeper than the fourth semiconductor region, the fifth semiconductor region in contact with the second semiconductor region, the third semiconductor region and the fourth semiconductor region; a first electrode embedded in the second trench; and a second electrode provided on a rear surface of the semiconductor substrate.

In the semiconductor devices, an impurity concentration of the first semiconductor region is a same as an impurity concentration of the fourth semiconductor region.

In the semiconductor devices, the first semiconductor layer has: a third semiconductor layer of the first conductivity type provided on the front surface of the semiconductor substrate, an impurity concentration of the third semiconductor layer is lower than that of the semiconductor substrate, and a fourth semiconductor layer of the first conductivity type provided on a front surface of the third semiconductor layer opposite a rear surface of the third semiconductor layer facing the semiconductor substrate, an impurity concentration of the fourth semiconductor layer is higher than that of the third semiconductor layer. The fourth semiconductor region is provided at a depth not reaching an interface of the third semiconductor layer and the fourth semiconductor layer from the bottom of the second trench.

In the semiconductor devices, an impurity concentration of the first semiconductor region is a same as an impurity concentration of the second semiconductor region.

In the semiconductor devices, the semiconductor substrate is a silicon carbide substrate.

According to another aspect of the present invention, a method of manufacturing a semiconductor device to include a first trench in which a gate electrode is embedded via a gate insulating film; a second-conductivity-type semiconductor region formed between a first semiconductor layer of a first conductivity type and a second semiconductor layer that is of the first conductivity type and has an impurity concentration higher than that of the first semiconductor layer, the second-conductivity-type semiconductor region facing the gate electrode across the gate insulating film provided on side walls of the first trench; a second trench formed between the first trench and an adjacent first trench; and a first electrode in contact with the second-conductivity-type semiconductor region and the second semiconductor layer at an inner wall of the second trench, includes: forming the first semiconductor layer of the first conductivity type on a front surface of a semiconductor substrate of the first conductivity type, an impurity concentration of the first semiconductor layer being lower than that of the semiconductor substrate; forming the second semiconductor layer of the first conductivity type on the first semiconductor layer, an impurity concentration of the second semiconductor layer being higher than that of the first semiconductor layer; forming a mask film on the second semiconductor layer, the mask film having an opening for a predetermined region; forming the second trench in the first semiconductor layer by etching using the mask film as a mask; first ion implanting a second-conductivity-type impurity from a first direction oblique with respect to a second direction perpendicular to the front surface of the semiconductor substrate, the first ion implanting using the mask film as mask to implant the second-conductivity-type impurity; second ion implanting the second-conductivity-type impurity from a third direction that is oblique with respect to the second direction and at a shallower angle than that in the first ion implanting, the second ion implanting using the mask film as a mask to implant the second-conductivity-type impurity; third ion implanting the second-conductivity-type impurity from the second direction using the mask film as a mask; and fourth ion implanting the second-conductivity-type impurity from a second semiconductor layer side after removing the mask film. The second-conductivity-type semiconductor region is formed by the first, second, and third ion implanting.

In the method, the first ion implanting includes implanting the second-conductivity-type impurity in side walls of the second trench, the second ion implanting includes plural stages of implanting the second-conductivity-type impurity at a bottom corner portion of the second trench, and the third ion implanting includes a plurality of stages of ion implanting the second-conductivity-type impurity at a bottom of the second trench.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
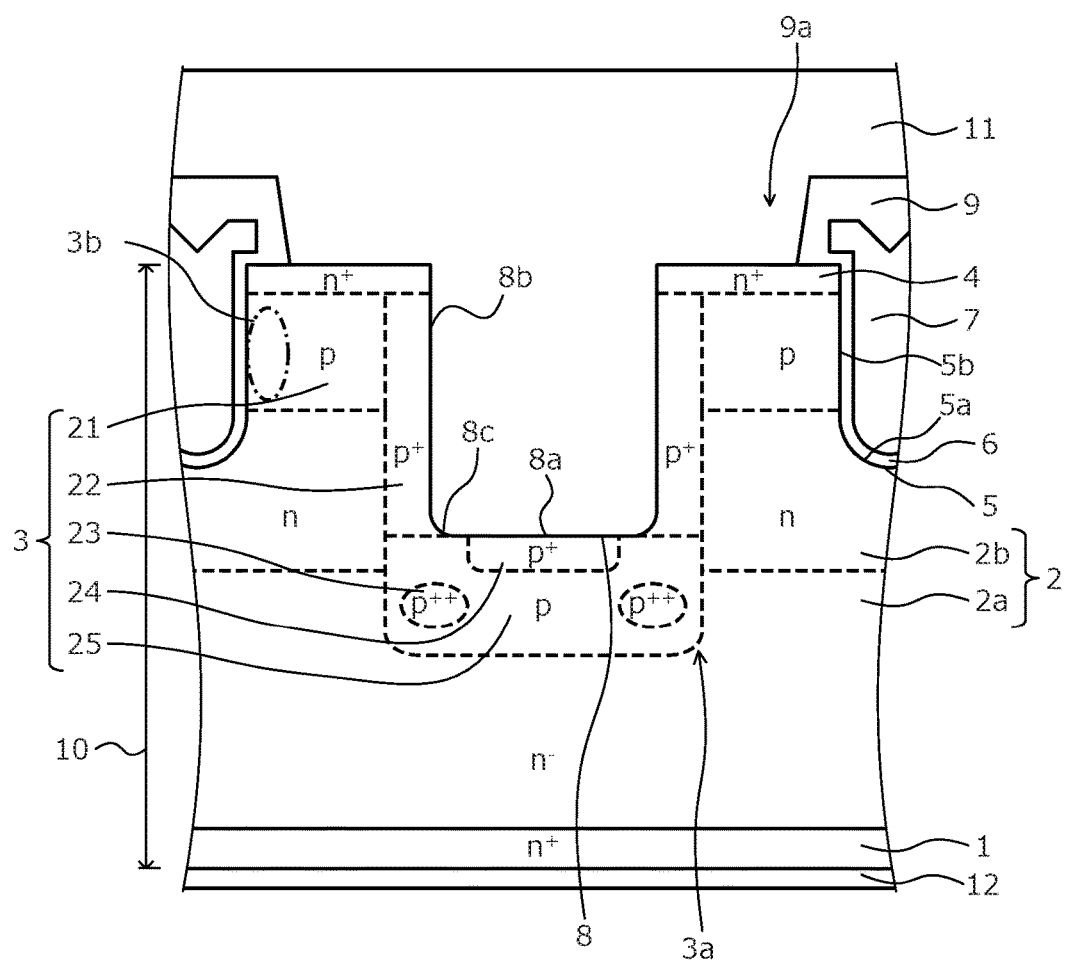
FIG. 1 is a cross-sectional view of a structure of an active region of a semiconductor device according to a first embodiment.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

A structure of a semiconductor device according to a first embodiment will be described taking, as an example, a trench-gate type MOSFET (SiC-MOSFET) that uses silicon carbide (SiC). FIG. 1 is a cross-sectional view of a structure of an active region of the semiconductor device according to the first embodiment. In FIG. 1, the structure between adjacent unit cells (functional unit of an element) is depicted and other unit cells repeatedly arranged to be adjacent to these unit cells, an edge termination region surrounding a periphery of the active, etc. are not depicted (similarly in FIG. 9). The semiconductor device according to the first embodiment depicted in FIG. 1 includes in an active region responsible for current driving, a trench-gate type MOS gate structure and a contact trench 8 on a front surface side of a semiconductor base (silicon carbide base) 10 containing silicon carbide.

In particular, the silicon carbide base 10 is formed by sequentially forming plural silicon carbide layers including an n$^-$-type drift layer 2 (2a, 2b) and an n$^+$-type source layer 4 by epitaxial growth on an n$^+$-type supporting substrate (n$^+$-type silicon carbide substrate) containing silicon carbide. On the front surface (surface on the n$^-$-type drift layer 2 side) side of the silicon carbide base 10, a MOS gate structure constituted by a p-type base region 3, the n$^+$-type source layer 4, gate trenches 5, gate insulating films 6, and gate electrodes 7 is provided. An impurity concentration of the n$^-$-type drift layer 2 may be higher at a portion (hereinafter, n-type high-concentration drift layer 2b) thereof on the base front surface side as compared to a portion (hereinafter, n$^-$-type low-concentration drift layer 2a) thereof on a base rear surface side. In other words, while the n$^-$-type drift layer 2 includes both a low-concentration layer 2a and a high-concentration layer 2b, the n$^-$-type drift layer 2 as a whole has a low concentration (n$^-$) relative to the high-concentration layer 2b. In the present specification and claims, the drift layer 2 may also be referred to as a first semiconductor layer. The n$^-$-type low-concentration drift layer 2a may be referred to as a third semiconductor layer, and the n-type high-concentration drift layer 2b may be referred to as a fourth semiconductor layer. The n$^+$-type source layer 4 may be referred to as a second semiconductor layer.

The gate trenches 5 are provided from the base front surface, penetrating the n$^+$-type source layer 4 to a depth, for example, not reaching the n$^-$-type low-concentration drift layer 2a. In the gate trenches 5, the gate electrodes 7 are embedded, via the gate insulating films 6. Between the adjacent gate trenches 5 (mesa portion), the contact trench 8 is provided. The contact trench 8 is a trench provided between the adjacent gate trenches 5 (mesa portion) and in which a metal electrode (source electrode described later (first electrode) 11) is embedded. At the metal electrode and the semiconductor region exposed at an inner wall (a bottom 8a and side walls 8b) of the contact trench 8, a contact (electrical contact portion) is formed. A depth of the contact trench 8 may be deeper that a depth of the gate trenches 5. Here, a case in which the depth of the contact trench 8 is deeper than the depth of the gate trenches 5 will be described as an example. Further, the contact trench 8 is provided to a depth not reaching an interface of the n$^-$-type low-concentration drift layer 2a and the n-type high-concentration drift layer 2b.

The p-type base region 3 is provided between the adjacent gate trenches 5, at a depth deeper than that of the gate trenches 5. Further, a portion of the p-type base region 3 is provided along the inner wall of the contact trench 8 so as to be exposed at the inner wall of the contact trench 8 and a depth of a portion of the p-type base region 3 along the bottom 8a of the contact trench 8 is deeper than a depth of the gate trenches 5. As a result, when the SiC-MOSFET is in an OFF state, a concentration of electric field at the gate insulating films 6 at bottoms 5a of the gate trenches 5 is mitigated by the electric field load at the portion of the p-type base region 3 along the bottom 8a of the contact trench 8.

The p-type base region 3 is formed by an ion implantation method enabling variation of the impurity concentration to be suppressed and enabling formation using existing manufacturing equipment. In particular, the p-type base region 3 is divided into plural regions and formed by multiple ion implantation stages of differing implantation angles and dose amounts. In other words, the p-type base region 3 has a predetermined impurity concentration profile formed by plural regions (e.g., 5 including first to fifth p-type base regions 21 to 25) of differing impurity concentrations.

The first p-type base region 21 is provided between the gate trenches 5, at a depth shallower than that of the gate trenches 5. The first p-type base region 21 is in contact with the n$^+$-type source layer 4 and a p$^+$-type contact region (not depicted and described later). A portion 3b of the first p-type base region 21 along side walls 5b of the gate trenches 5 is a formation region of a channel (an n-type inversion layer that is formed) when the SiC-MOSFET is in an ON state. While FIG. 1 illustrates the first p-type base region 21 as having an impurity concentration less than that of the second and fourth p$^+$-type base regions 22, 24, in one embodiment, the impurity concentration of the first p-type base region 21 may be substantially the same as an impurity concentration of the second and fourth p$^+$-type base regions 22, 24.

The second p$^+$-type base region 22 is provided along the side walls 8b of the contact trench 8 so as to be exposed at the side walls 8b of the contact trench 8. In addition, the second p$^+$-type base region 22 is arranged so as to cover bottom corner portions (boundary of the bottom 8a and the side walls 8b of the contact trench 8) 8c of the contact trench 8. Further, the second p$^+$-type base region 22 is in contact with the first p-type base region 21, the n$^+$-type source layer 4, and a p$^+$-type contact region described later.

The third p$^{++}$-type base region 23 is selectively provided at portions (corner portions) 3a of the p-type base region 3 along the bottom corner portions 8c of the contact trench 8. The third p$^{++}$-type base region 23 is arranged in the fifth p-type base region 25 and has an island-like shape having a periphery entirely covered by the fifth p-type base region 25. The third p$^{++}$-type base region 23 has a function of mitigating the electric field of the corner portion 3a of the p-type base region 3 and preventing punch-through at the corner portions 3a of the p-type base region 3. An impurity concentration of the third p$^{++}$-type base region 23 may be higher than the impurity concentration the fourth p$^+$-type base region 24.

The fourth p$^+$-type base region 24 is provided along the bottom 8a of the contact trench 8 and is exposed at a portion of the bottom 8a of the contact trench 8 at least. Further, a drain side of the fourth p$^+$-type base region 24 is covered by the fifth p-type base region 25. Further, the fourth p$^+$-type base region 24 is arranged away from the third p$^{++}$-type base region 23. The fourth p$^+$-type base region 24 has a function of reducing contact resistance between the fourth p$^+$-type base region 24 and the source electrode 11. Further, while FIG. 1 shows a depth (from the top surface of the source layer 4) of the fourth p$^+$-type base region 24 as being around a depth of the interface of the n$^-$-type low-concentration drift layer 2a and the n-type high-concentration drift layer 2b, according to one embodiment, the fourth p$^+$-type base region 24 is provided at a depth not reaching the depth of the interface of the n$^-$-type low-concentration drift layer 2a and the n-type high-concentration drift layer 2b.

The fifth p-type base region 25 is in contact with the second and fourth p$^+$-type base regions 22, 24, and is provided along the bottom 8a of the contact trench 8. A depth of the fifth p-type base region 25 from the bottom 8a of the contact trench 8 is deeper than a depth of the fourth p$^+$-type base region 24. In the fifth p-type base region 25, one or more third p$^{++}$-type base regions 23 is arranged. The fifth p-type base region 25 may be positioned farther on a drain side than an interface of the n$^-$-type low-concentration drift layer 2a and the n-type high-concentration drift layer 2b is. An impurity concentration of the fifth p-type base region 25 is lower than an impurity concentration of the third p$^{++}$-type base region 23 and the fourth p$^+$-type base region 24.

In a surface region on the front surface of the silicon carbide base 10, a p$^+$-type contact region (not depicted) is selectively provided so as to be in contact with the first p-type base region 21. A contact hole 9a penetrating an interlayer insulating film 9 in the depth direction is formed so as to be connected to the contact trench 8. The source electrode 11 is provided so as to be embedded in the contact hole 9a and the contact trench 8, and is in contact with the second and fourth p$^+$-type base regions 22, 24, the third p$^{++}$-type base region 23, the fifth p-type base region 25, the n$^+$-type source layer 4, and a p$^+$-type contact region. On a rear surface (surface on an n$^+$-type silicon carbide substrate 1 side, the n$^+$-type silicon carbide substrate 1 being an n$^+$-type drain layer) of the silicon carbide base 10, a drain electrode 12 is provided as a rear electrode.

A method of manufacturing a semiconductor device according to the first embodiment will be described taking, as an example, a case in which a 3300V trench-gate type SiC-MOSFET is produced (manufactured). FIGS. 2, 3, 4, 5, 6, 7 and 8 are cross-sectional views of the semiconductor device according to the first embodiment during manufacture.

Figure 2:
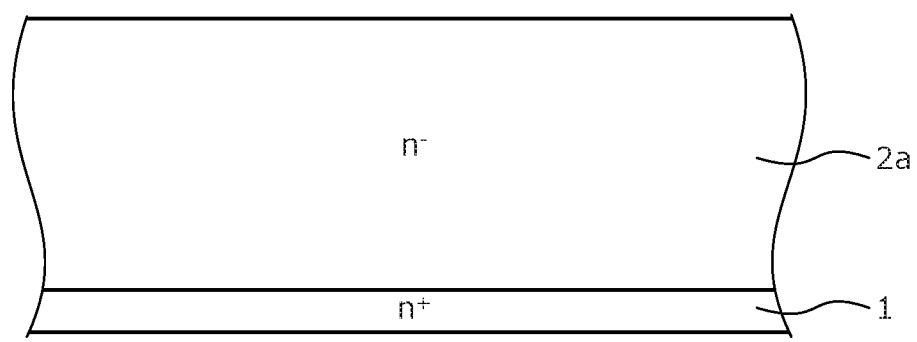
FIGS. 2, 3, 4, 5, 6, 7 and 8 are cross-sectional views of the semiconductor device according to the first embodiment during manufacture.
Figure 3:
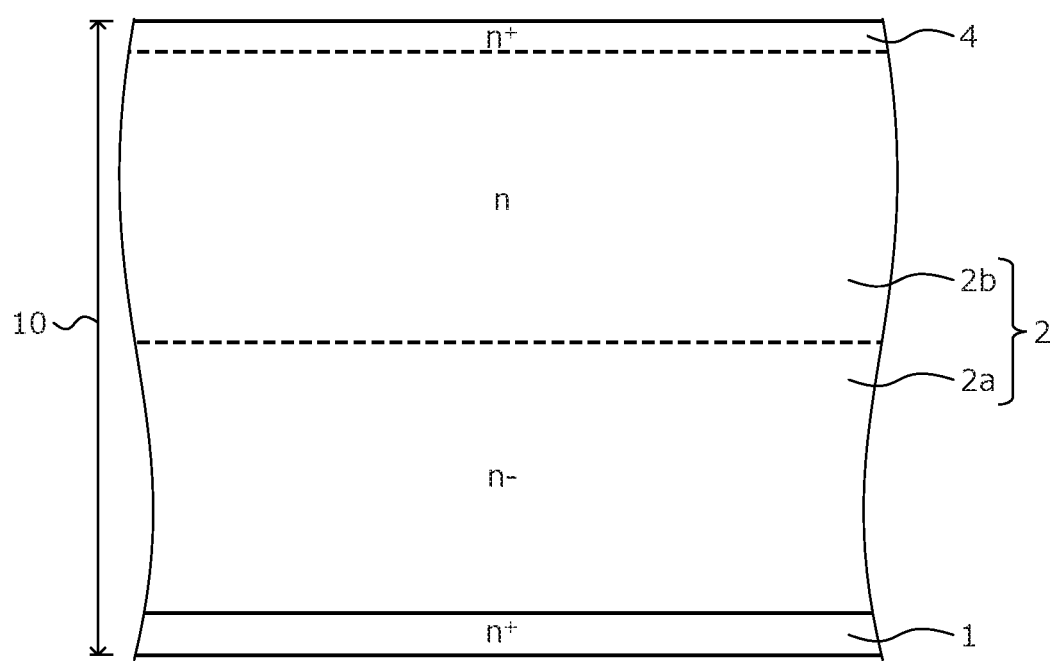

First, for example, the n$^+$-type silicon carbide substrate 1 having an impurity concentration of about, for example, $1\times10^{18}$/cm$^3$ to $1\times10^{20}$/cm$^3$ is prepared. The front surface of the n$^+$-type silicon carbide substrate 1 may have an off angle of about, for example, 0.1 degrees to 8 degrees. Next, by epitaxial growth on the front surface of the n$^+$-type silicon carbide substrate 1, an n$^-$-type silicon carbide layer to become the n$^-$-type low-concentration drift layer 2a having an impurity concentration of about, for example, $2\times10^{15}$/cm$^3$ to $4\times10^{15}$/cm$^3$ is deposited (formed) to have a thickness of about, for example, 25 μm to 30 μm. The state up to here is depicted in FIG. 2.

Next, an n-type silicon carbide layer to become the n-type high-concentration drift layer 2b having an impurity concentration of about, for example, $1\times10^{16}$/cm$^3$ to $1\times10^{18}$/cm$^3$ is deposited by epitaxial growth on the n$^-$-type low-concentration drift layer 2a to have a thickness of about, for example, 0.5 μm to 3.0 μm. Next, an n$^+$-type silicon carbide layer to become the n$^+$-type source layer 4 having an impurity concentration of about, for example, $1\times10^{18}$/cm$^3$ to $3\times10^{20}$/cm$^3$ is deposited by epitaxial growth on the n-type high-concentration drift layer 2b to have a thickness of about, for example, 0.05 μm to 1.0 μm. By the processes up to here, the silicon carbide base (semiconductor wafer) 10 is formed in which the n$^-$-type drift layer 2 (2a, 2b) and the n$^+$-type silicon carbide layer are sequentially stacked on the n$^+$-type silicon carbide substrate 1.

Figure 4:
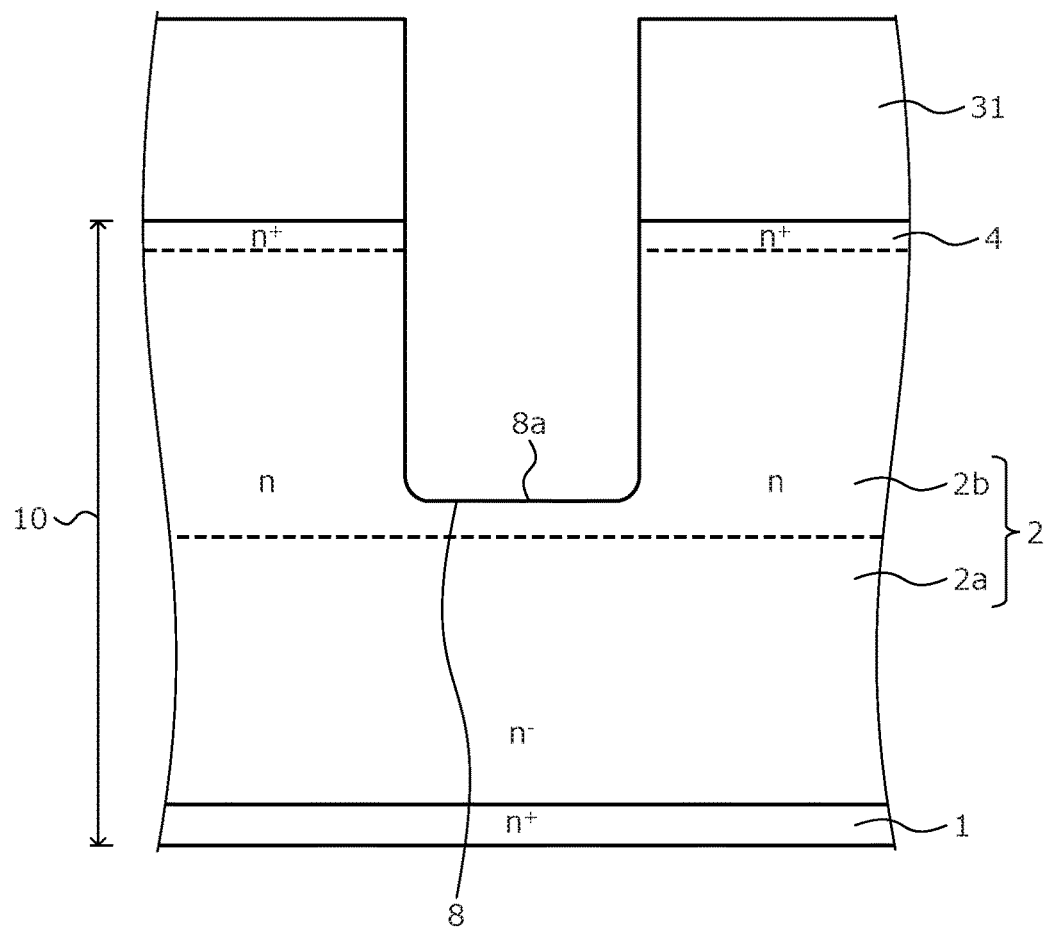

Next, on the front surface (surface on the n$^+$-type source layer 4 side) of the silicon carbide base 10, an oxide film 31 is deposited to have a thickness of about, for example, 1.5 μm to 2.5 μm. Next, the oxide film 31 is patterned by photolithography and etching, exposing a portion corresponding to a formation region of the contact trench 8. Next, after a resist mask (not depicted) used in patterning the oxide film 31 is removed, etching is performed using the remaining portion of the oxide film 31 as a mask and the contact trench 8 is formed. The depth of the contact trench 8 may be about, for example, 0.5 μm to 5.0 μm. A width of the contact trench 8 may be about, for example, 0.1 μm to 3.0 μm. The state up to here is depicted in FIG. 4.

Next, the same oxide film 31 used in forming the contact trench 8 is used as a mask to ion implant a p-type impurity in both of the side walls 8b of the contact trench 8, respectively, under the same conditions and from a direction oblique to a direction perpendicular to the substrate front surface (hereinafter, first oblique ion implantation) 32. By the first oblique ion implantation 32, the second p$^+$-type base region 22 is formed in a portion along the side walls 8b of the contact trench 8. At this time, the second p$^+$-type base region 22 may be formed at the bottom 8a of the contact trench 8.

In the first oblique ion implantation 32, a dopant may be, for example, aluminum (Al). An implantation angle θ1 may be about, for example, 25 degrees with respect to a direction perpendicular to the substrate front surface. Acceleration energy may be about, for example, 860 keV. A dose amount may be about, for example, $4.0\times10^{13}$/cm$^2$. A depth d1 of the second p$^+$-type base region 22 from the side walls 8b of the contact trench 8 may be, for example, 0.5 μm.

In this manner, by performing the first oblique ion implantation 32 to the depth d1, which is shallow with respect to the side walls 8b of the contact trench 8, the first oblique ion implantation 32 may be prevented from reaching a formation region of a channel. The formation region of the channel is a portion along the side walls 5b of the gate trenches 5. The state up to here is depicted in FIG. 5.

Figure 5:
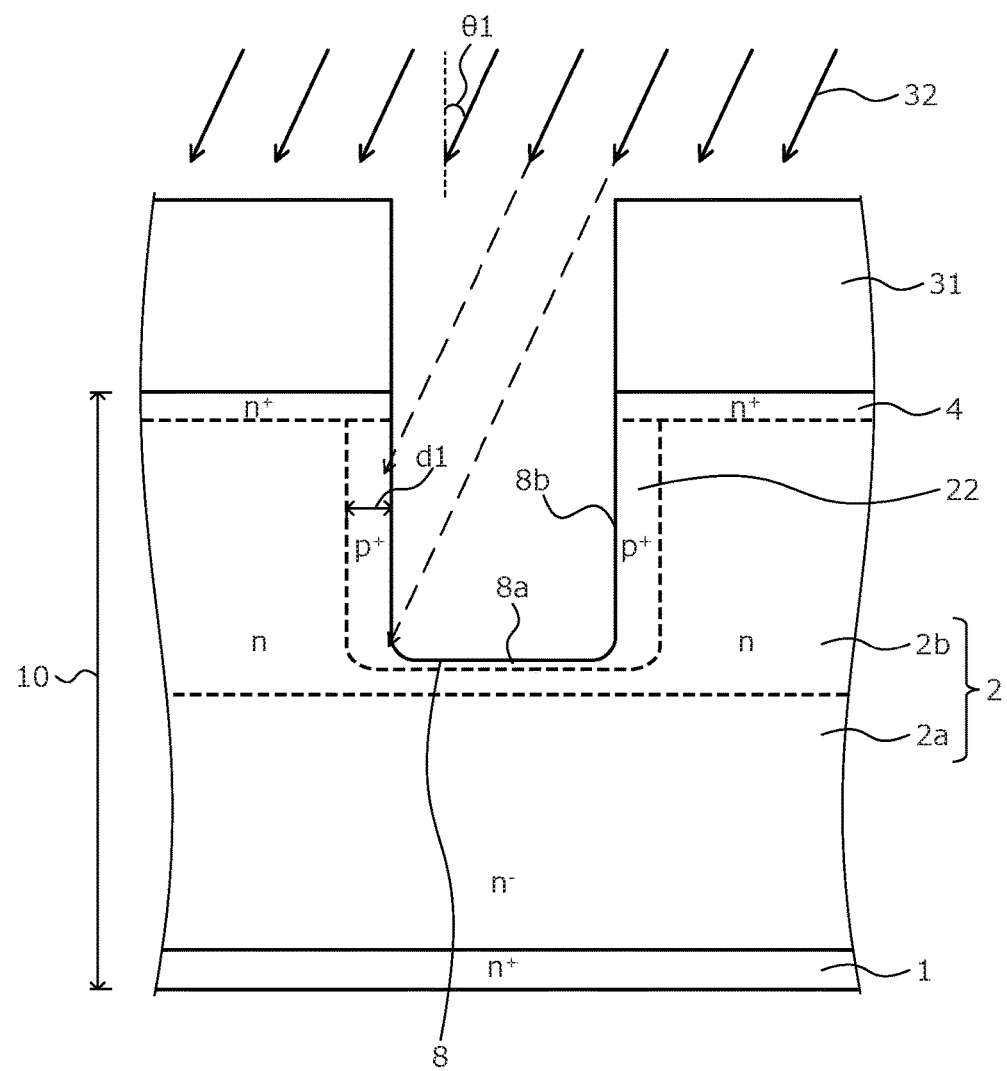

FIG. 5 depicts a state in which the first oblique ion implantation 32 is being performed for one of the side walls 8b of the contact trench 8 after the first oblique ion implantation 32 was performed for the other side wall 8b of the contact trench 8. For example, when the contact trench 8 has a polygonal planar shape, the first oblique ion implantation 32 is performed similarly for all of the side walls 8b of the contact trench 8, respectively.

Next, the same oxide film 31 used in forming the contact trench 8 is used as a mask to ion implant a p-type impurity in both of the bottom corner portions 8c of the contact trench 8, respectively, under the same conditions and from a direction oblique to a direction perpendicular to the substrate front surface (hereinafter, the second oblique ion implantation) 33. The second oblique ion implantation 33 is performed by an implantation angle θ2 that is shallower than the angle of the first oblique ion implantation 32 with respect to a direction perpendicular to the substrate front surface. Further, the second oblique ion implantation 33 is performed in multiple stages (plural stages) of differing conditions.

By the multiple stages of the second oblique ion implantation 33, near the bottom corner portions 8c of the contact trench 8, a p-type region 34 to become the fifth p-type base region 25 is formed so as to be in contact with the second p$^+$-type base region 22. In addition, the third p$^{++}$-type base region 23 is formed in an island-like shape in the p-type region 34. In this manner, by performing the second oblique ion implantation 33 by the implantation angle θ2, which is shallow with respect to a direction perpendicular to the substrate front surface, the second oblique ion implantation 33 may be prevented from reaching the formation region of the channel.

Figure 6:
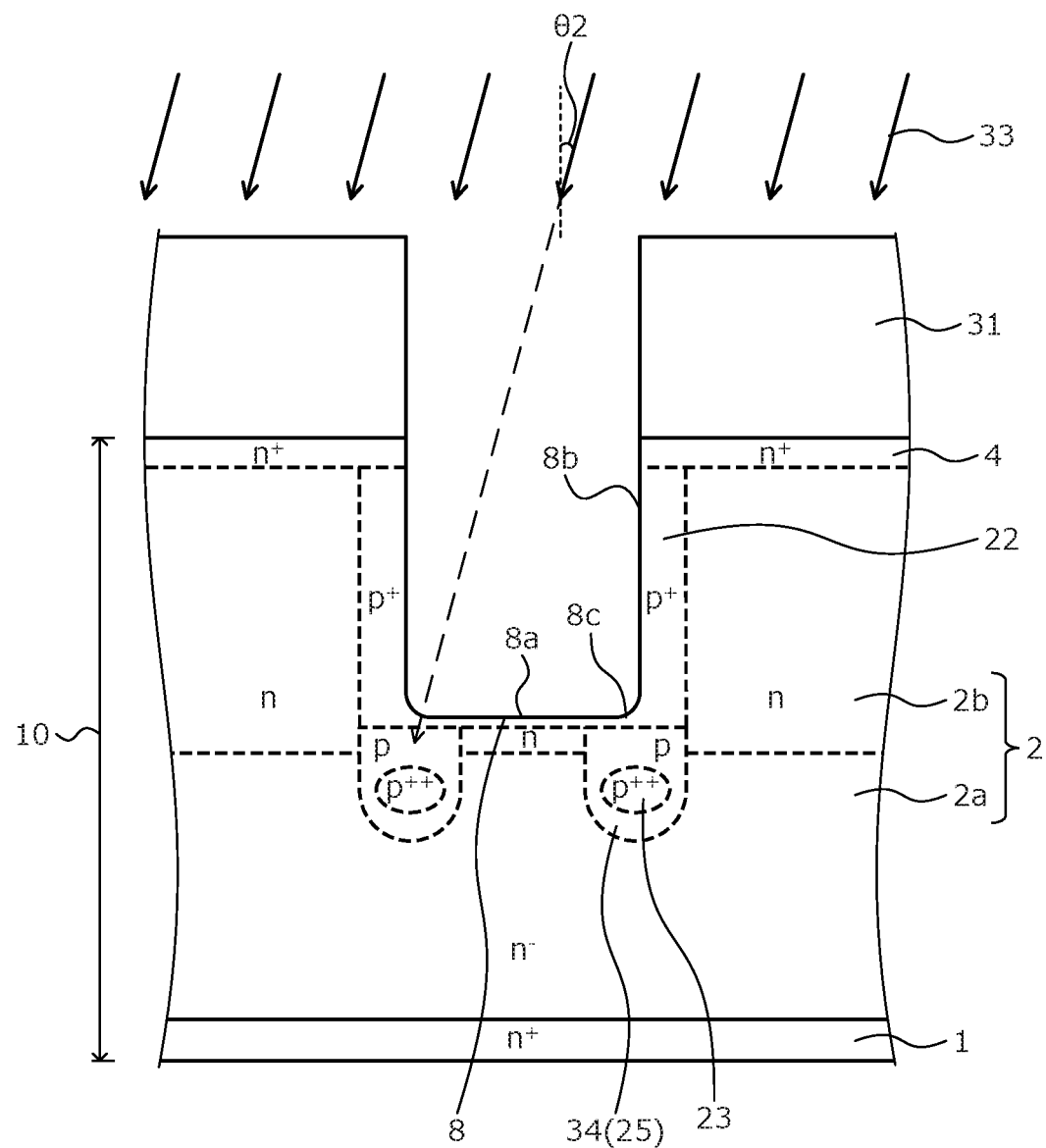

In the second oblique ion implantation 33, a dopant may be, for example, aluminum. The implantation angle θ2 may be about, for example, 15 degrees with respect to a direction perpendicular to the substrate front surface. When the second oblique ion implantation 33 is performed in 3 stages (3 times), for example, in a first stage, for example, the acceleration energy may be about 800 keV and the dose amount may be about $4.0 \times 10^{13}/cm^2$. In a second stage, the acceleration energy may be about 400 keV and the dose amount may be about $4.0 \times 10^{13}/cm^2$. In a third stage, the acceleration energy may be about 100 keV and the dose amount may be about $4.0 \times 10^{13}/cm^2$. The state up to here is depicted in FIG. 6.

For example, when the contact trench 8 has a polygonal planar shape, the second oblique ion implantation 33 is performed for all of the bottom corner portions 8c of the contact trench 8 under the same conditions.

Next, the same oxide film 31 used in forming the contact trench 8 is used as a mask to ion implant a p-type impurity in the bottom 8a of the contact trench 8, from a perpendicular direction of 0 degrees with respect to a direction perpendicular to the substrate front surface (hereinafter, a third ion implantation) 35. The third ion implantation 35 is performed in multiple stages of differing conditions. By the multiple stages of the third ion implantation 35, the fourth p$^+$-type base region 24 is formed so as to be exposed at the bottom 8a of the contact trench 8. In addition, a p-type region 36 that becomes the fifth p-type base region 25 is formed so as to cover the drain side of the fourth p$^+$-type base region 24. In this manner, by performing the third ion implantation 35 by an angle of 0 degrees with respect to a direction perpendicular to the substrate front surface, the third ion implantation 35 may be prevented from reaching the formation region of the channel.

Figure 7:
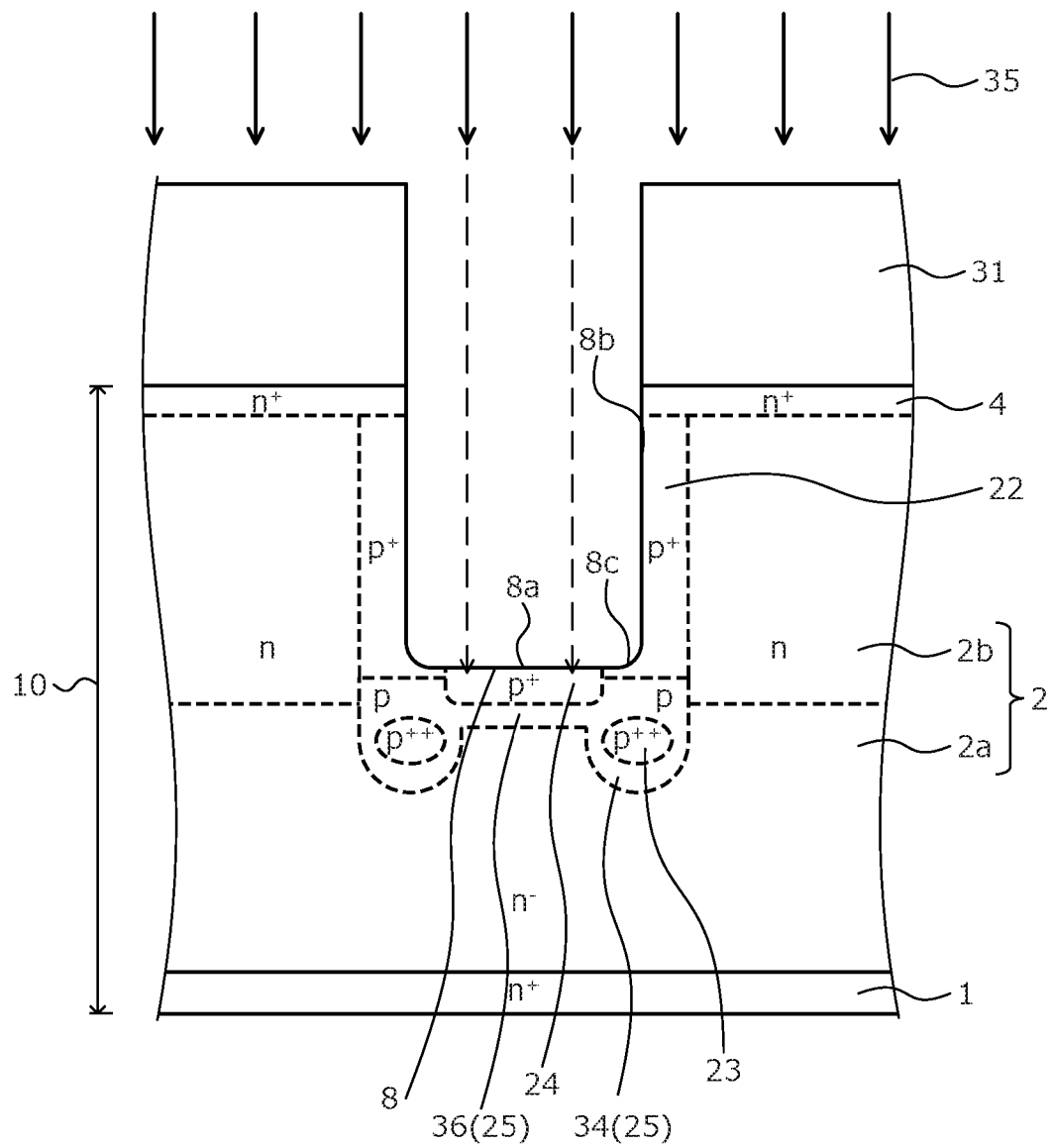

In the third ion implantation 35, the dopant may be, for example, aluminum. When the third ion implantation 35 is performed in 4 stages (4 times), for example, in a first stage, for example, the acceleration energy may be about 200 keV and the dose amount may be about $5.0 \times 10^{15}/cm^2$. In a second stage, the acceleration energy may be about 130 keV and the dose amount may be about $3.0 \times 10^{15}/cm^2$. In a third stage, for example, the acceleration energy may be about 80 keV and the dose amount may be about $2.0 \times 10^{15}/cm^2$. In a fourth stage, the acceleration energy may be about 30 keV and the dose amount may be about $1.5 \times 10^{15}/cm^2$. The state up to here is depicted in FIG. 7.

The sequence of the first and second oblique ion implantations 32, 33 and the third ion implantation 35 may be interchanged.

Next, the remaining portion of the oxide film 31 is removed by, for example, hydrogen fluoride (HF). Next, a p-type impurity is ion implanted in the base front surface, from a perpendicular direction of 0 degrees with respect to a direction perpendicular to the substrate front surface (hereinafter, a fourth ion implantation) 37. The fourth ion implantation is performed in multiple stages of differing conditions. Further, the fourth ion implantation 37 is performed under a condition that the n$^+$-type source layer 4 is not inverted to a p-type. By the multiple stages of the fourth ion implantation 37, the first p-type base region 21 is formed in a surface region of the n$^-$-type low-concentration drift layer 2a. In addition, a p-type region 38 to become the fifth p-type base region 25 is formed at a portion of the n$^-$-type drift layer 2 deeper than the p-type region 36 near the bottom 8a of the contact trench 8. As a result, the fifth p-type base region 25 having a predetermined cross-sectional shape is formed and the p-type base region 3 constituted by the first to fifth p-type base regions 21 to 25 is formed.

In the fourth ion implantation 37, the dopant may be, for example, aluminum. When the fourth ion implantation 37 is performed in 10 stages (10 times), for example, in the first stage, for example, the acceleration energy may be about 800 keV and the dose amount may be about $5.0 \times 10^{12}/cm^2$. In the second stage, the acceleration energy may be about 700 keV and the dose amount may be about $5.0 \times 10^{12}/cm^2$. In the third stage, for example, the acceleration energy may be about 600 keV and the dose amount may be about $2.5 \times 10^{12}/cm^2$. In the fourth stage, the acceleration energy may be about 500 keV and the dose amount may be about $4.5 \times 10^{12}/cm^2$.

Figure 8:
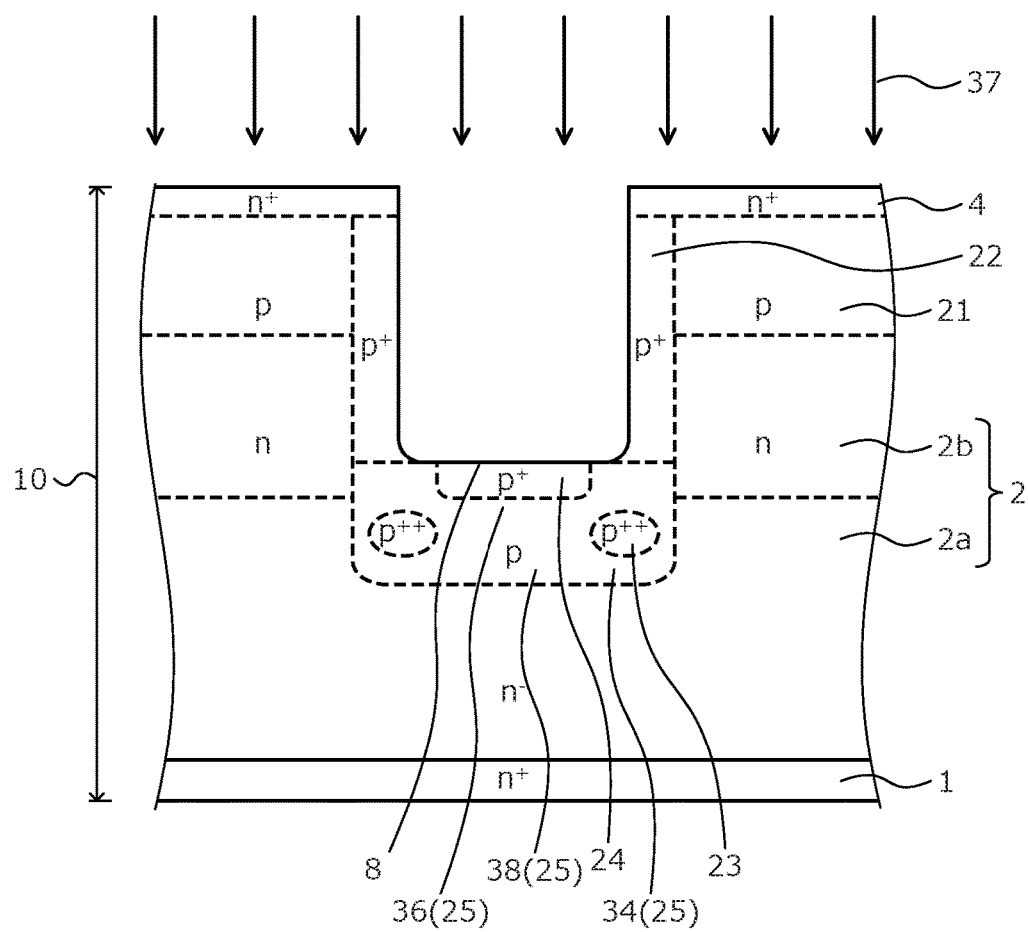

In the fifth stage, the acceleration energy may be about 400 keV and the dose amount may be about $4.5 \times 10^{12}/cm^2$. In the sixth stage, the acceleration energy may be about 300 keV and the dose amount may be about $4.5 \times 10^{12}/cm^2$. In the seventh stage, the acceleration energy may be about 200 keV and the dose amount may be about $4.0 \times 10^{12}/cm^2$. In the eighth stage, the acceleration energy may be about 130 keV and the dose amount may be about $2.5 \times 10^{12}/cm^2$. In the ninth stage, the acceleration energy may be about 80 keV and the dose amount may be about $2.0 \times 10^{12}/cm^2$. In the tenth stage, the acceleration energy may be about 30 keV and the dose amount may be about $1.5 \times 10^{12}/cm^2$. The state up to here is depicted in FIG. 8.

Next, on the front surface of the silicon carbide base 10, an oxide film (not depicted) is deposited to have a thickness of, for example, about 1.5 µm to 2.5 µm. Next, the oxide film is patterned by photolithography and etching, exposing a portion corresponding to a formation region of the gate trenches 5. Next, after a resist mask (not depicted) used in patterning the oxide film is removed, etching is performed using the remaining portion of the oxide film as a mask and the gate trenches 5 are formed. The depth of the gate trenches 5 may be about, for example, 0.5 µm to 2.5 µm. A width of the gate trenches 5 may be about, for example, 0.5 µm to 2.0 µm. The remaining portion of the oxide film used in forming the gate trenches 5 is removed.

Next, on the front surface of the silicon carbide base 10, an oxide film (for example, a SiO$_2$ film) is deposited along an inner wall of the gate trenches 5, to have a thickness of, for example, 10 nm to 500 nm, forming the gate insulating films 6. Next, heat treatment is performed in a nitrogen (N$_2$)

atmosphere at a temperature of about, for example, 800 degrees C. to 1200 degrees C. Next, on the front surface of the silicon carbide base 10, a poly-silicon layer is deposited to have a thickness of about, for example, 0.3 µm to 1.5 µm and to be embedded in the gate trenches 5. The poly-silicon layer is patterned by photolithography and etching, leaving the poly-silicon layer in the gate trenches 5 to become the gate electrodes 7. Next, in the front surface of the silicon carbide base 10, the interlayer insulating film 9 is deposited to have a thickness of about, for example, 0.5 µm to 1.5 µm.

Next, the interlayer insulating film 9 is patterned by photolithography and etching, forming the contact hole 9a. Next, without removing a resist mask (not depicted) used in patterning the interlayer insulating film 9, a nickel (Ni) film (not depicted) is deposited on the front surface side of the silicon carbide base 10. Next, the silicon carbide base 10 is, for example, soaked in acetone, and the resist mask is removed by lift-off of the nickel film on the resist mask. Next, for example, an aluminum film is deposited so as to be embedded in the contact hole 9a, forming the source electrode 11 on the base front surface side; and the drain electrode 12 is formed on the rear surface of the silicon carbide base 10. Thereafter, the semiconductor wafer is diced (cut) into individual chips whereby the trench-gate type SiC-MOSFET depicted in FIG. 1 is completed.

As described, according to the first embodiment, by selectively arranging the third p-type base region having a high impurity concentration near the bottom corner portion of the contact trench, electric field at the corner portion of the p-type base region may be mitigated and punch-through may be prevented. As a result, decreases in breakdown voltage and increases in leak current may be prevented. Further, according to the first embodiment, the p-type base region is divided into plural regions and ion implantation is performed at a shallow depth with respect to the side wall of the contact trench to form the second p-type base region. In addition, ion implantation at 0 degrees or a shallow angle with respect to a direction perpendicular to the substrate front surface is performed to form the third and fourth p-type base regions. Therefore, the ion implantations for forming the second to fourth p-type base regions having relatively high impurity concentrations does not reach the formation region of the channel. Thus, increases in the gate threshold voltage and increases in channel resistance may be prevented. Moreover, since the fourth p-type base region having a high impurity concentration is arranged so as to be exposed at the bottom of the contact trench, the contact resistance may be reduced.

Figure 9:
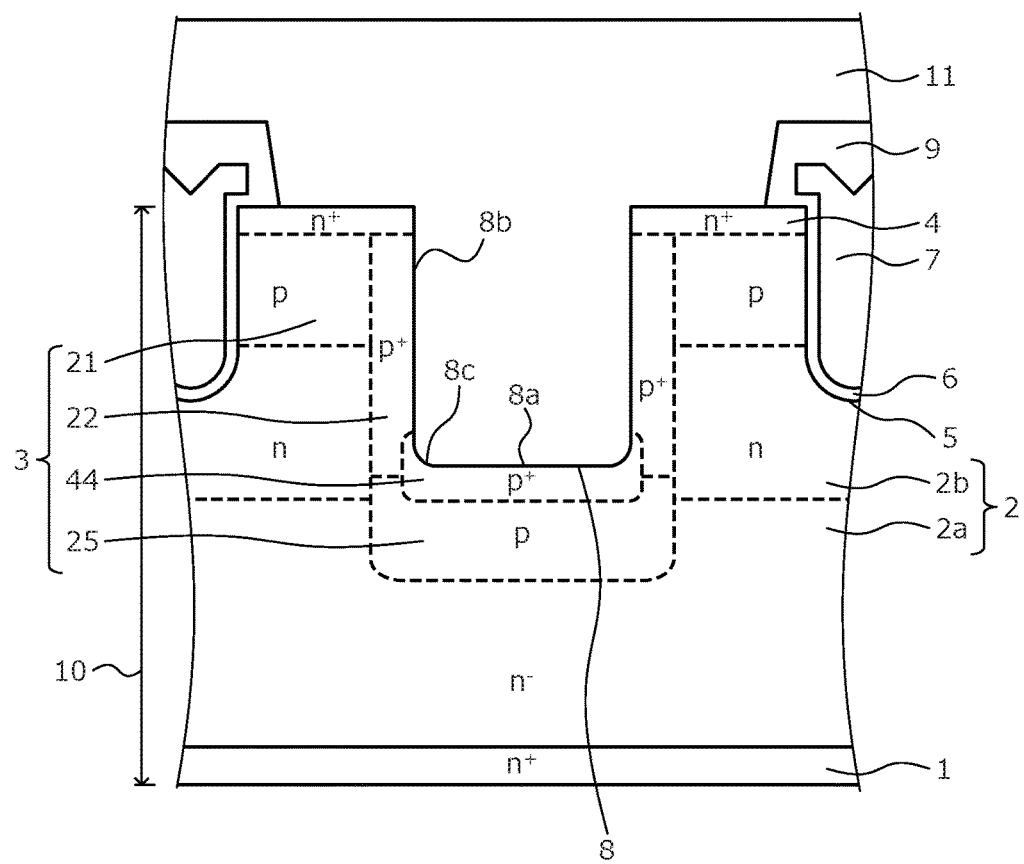
FIG. 9 is a cross-sectional view of a structure of the semiconductor device according to a second embodiment.

A structure of the semiconductor device according to a second embodiment will be described. FIG. 9 is a cross-sectional view of a structure of the semiconductor device according to the second embodiment. The semiconductor device according to the second embodiment differs from the semiconductor device according to the first embodiment on the following two points. A first difference is that the third $p^{++}$-type base region (corresponds to reference numeral 23 in FIG. 1) in the fifth p-type base region 25 is not provided. A second difference is that a fourth $p^+$-type base region 44 provided along the bottom 8a of the contact trench 8 extends to the bottom corner portions 8c of the contact trench 8 and covers the bottom corner portions 8c of the contact trench 8. In other words, a width of the fourth $p^+$-type base region 44 is wider than the width of the contact trench 8. The fourth $p^+$-type base region 44 has a function of mitigating the electric field of the corner portions 3a of the p-type base region 3 to prevent punch-through and a function of reducing the contact resistance with the source electrode 11.

Figure 10:
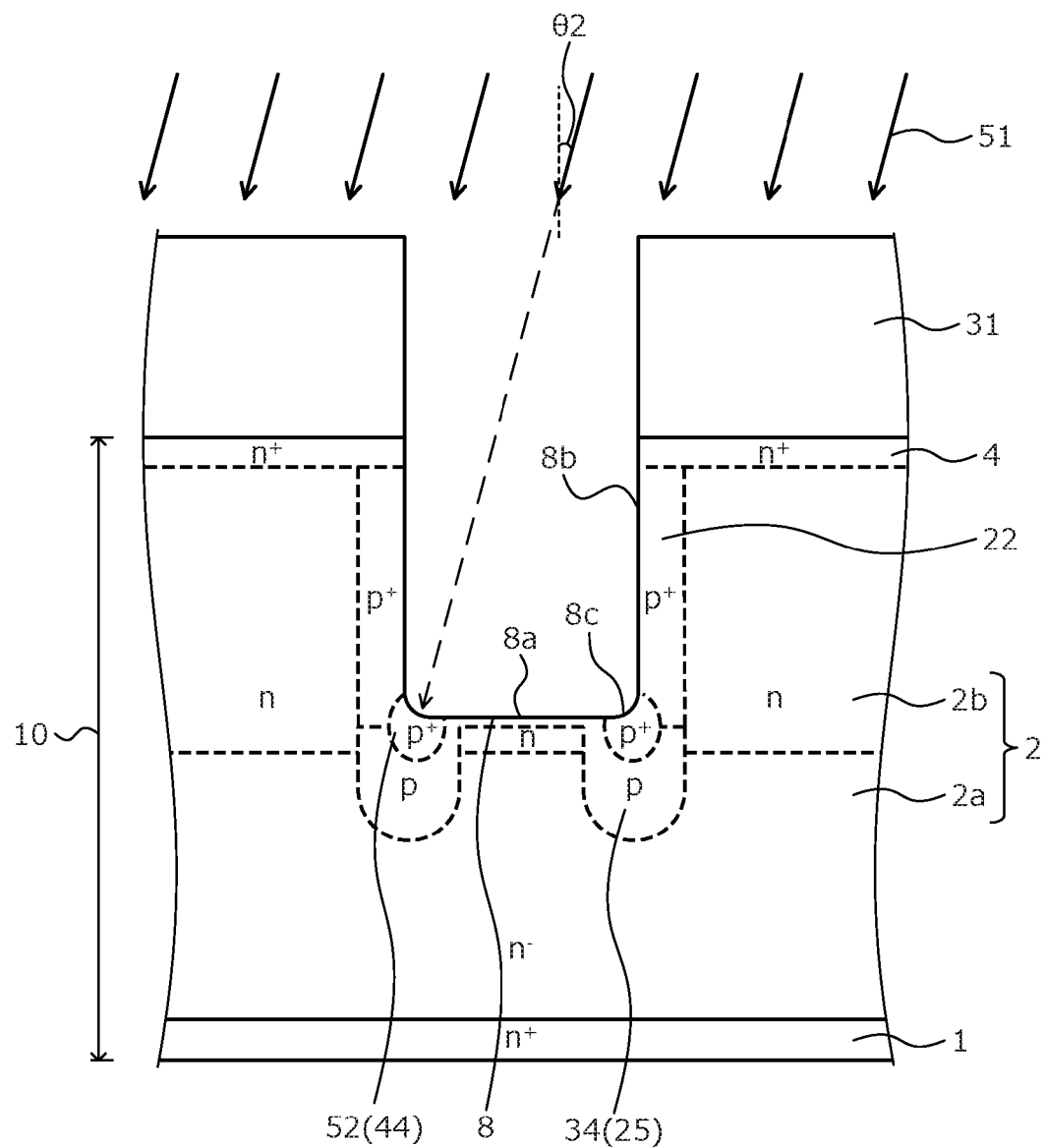
FIGS. 10 and 11 are cross-sectional views of the semiconductor device according to the second embodiment during manufacture.
Figure 11:
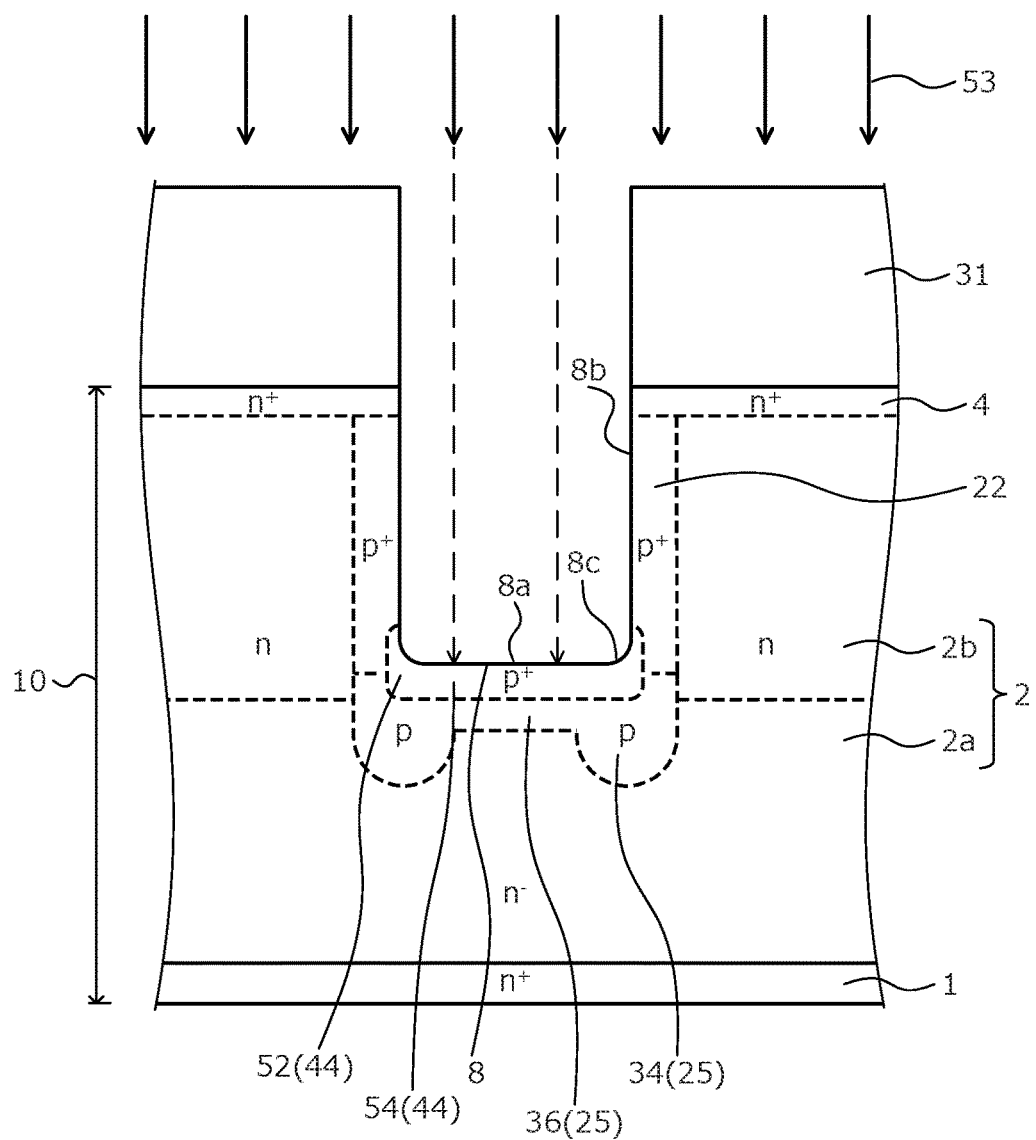
Figure 12:
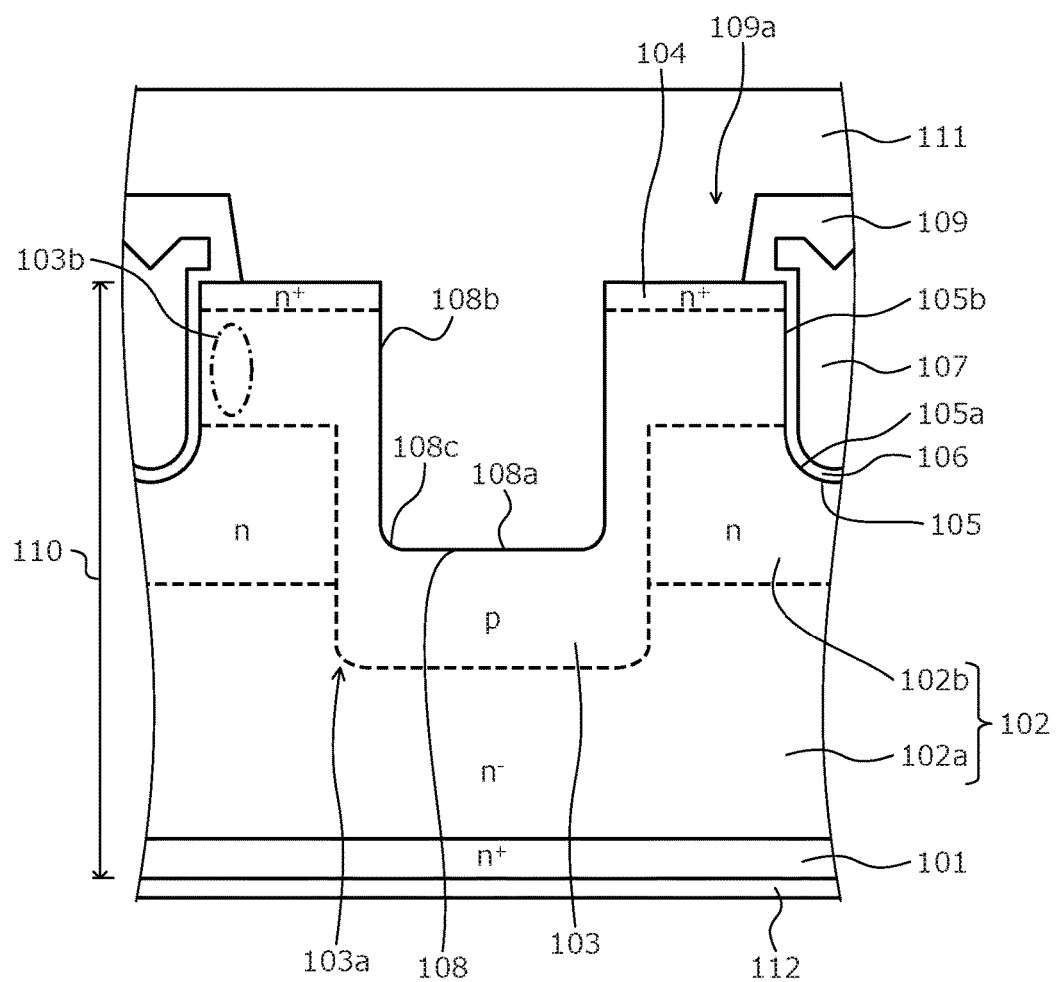
FIG. 12 is a cross-sectional view of a structure of an active region of a conventional trench-gate type SiC-MOSFET.

The semiconductor device according to the second embodiment, for example, is produced in the following manner. FIGS. 10 and 11 are cross-sectional views of the semiconductor device according to the second embodiment during manufacture. First, similar to the first embodiment, processes from the formation (epitaxial growth) of the $n^-$-type low-concentration drift layer 2a to the formation of the second $p^+$-type base region 22 are sequentially performed (refer to FIGS. 2 to 5). Next, the same oxide film 31 used in forming the contact trench 8 is used as a mask to perform ion implantation of a p-type impurity in both of the bottom corner portions 8c of the contact trench 8, respectively, under the same conditions and from a direction oblique with respect to a direction perpendicular to the substrate front surface (a second oblique ion implantation) 51.

The second oblique ion implantation 51 is performed by the implantation angle $\theta 2$ that is shallower than the angle of the first oblique ion implantation 32 with respect to a direction perpendicular to the substrate front surface. Further, the second oblique ion implantation 51 is performed in multiple stages of differing conditions. By the multiple stages of the second oblique ion implantation 51, a $p^+$-type region 52 to become the fourth $p^+$-type base region 44 is formed so as to cover the bottom corner portions 8c of the contact trench 8. In addition, the p-type region 34 to become the fifth p-type base region 25 is formed so as to cover the drain side of the $p^+$-type region 52. Here, similar to the first embodiment, the second oblique ion implantation 51 may be prevented from reaching the formation region of the channel.

In the second oblique ion implantation 51, the dopant may be, for example, aluminum. The implantation angle $\theta 2$ may be, for example, 15 degrees with respect to a direction perpendicular to the substrate front surface. When the second oblique ion implantation 51 is performed in 4 stages, for example, in the first stage, for example, the acceleration energy may be about 200 keV and the dose amount may be about $5.0 \times 10^{15}/cm^2$. In the second stage, the acceleration energy may be about 130 keV and the dose amount may be about $3.0 \times 10^{15}/cm^2$. In the third stage, the acceleration energy may be about 80 keV and the dose amount may be about $2.0 \times 10^{15}/cm^2$. In the fourth stage, the acceleration energy may be about 30 keV and the dose amount may be about $1.5 \times 10^{15}/cm^2$. The state up to here is depicted in FIG. 10. FIG. 10 depicts a state in which the second oblique ion implantation 51 is being performed for one of the bottom corner portions 8c of the contact trench 8 after the second oblique ion implantation 51 was performed in multiple stages for the other bottom corner portion 8c of the contact trench 8. For example, when the contact trench 8 has a polygonal planar shape, the second oblique ion implantation 51 is performed for all of the bottom corner portions 8c of the contact trench 8, respectively, under the same conditions.

Next, the same oxide film 31 used in forming the contact trench 8 is used to ion implant a p-type impurity in the bottom 8a of the contact trench 8, from a perpendicular direction of 0 degrees with respect to a direction perpendicular to the substrate front surface (third ion implantation) 53. The third ion implantation 53 is performed in multiple stages (for example, 4 stages) of differing conditions. By the multiple stages of the third ion implantation 53, similar to the first embodiment, a $p^+$-type region 54 to become the fourth $p^+$-type base region 44 is formed so as to be exposed at the bottom 8a of the contact trench 8. In addition, the p-type region 36 to become the fifth p-type base region 25 is formed so as to cover the drain side of the p+-type region 54. As a result, the fourth p$^+$-type base region 44 having a predetermined cross-sectional shape is formed. Here, similar to the first embodiment, the third ion implantation 53 may be prevented from reaching the formation region of the channel. The state up to here is depicted in FIG. 11.

Thereafter, similar to the first embodiment, processes from the formation of the fourth ion implantation and thereafter are performed whereby the trench-gate type SiC-MOSFET depicted in FIG. 9 is completed.

As described, according to the second embodiment, effects identical to those of the first embodiment may be obtained.

In the present invention, various modifications are possible. In the embodiments, for example, dimensions, impurity concentrations, etc. of regions and the like may be set according to required specifications. Further, in the embodiments, although the n$^+$-type source layer is formed by epitaxial growth, the n$^+$-type source layer may be a diffusion layer formed by ion implantation. Further, in the embodiments, although a MOSFET has been described as an example, the present invention is applicable to a semiconductor device having an active region in which a trench (groove) embedded with an electrode is provided such as an insulated gate bipolar transistor (IGBT). Further, in the embodiments although a first conductivity type is assumed as an n and a second conductivity type is assumed as a p-type, the present invention is similarly implemented when the first conductivity type is a p-type and the second conductivity type is an n-type.

Nonetheless, with the conventional trench-gate type SiC-MOSFET, in the OFF state, electric field easily concentrates at corner portions 103a of the p-type base region 103 along the bottom corner portions 108c of the contact trench 108. Therefore, there is concern that punch-through may occur leading to decreased breakdown voltage or increased leak current. The bottom corner portions 108c of the contact trench 108 are boundaries of the bottom 108a and the side walls 108b of the contact trench 108.

This problem may be avoided by increasing the dose amount of the ion implantation to the side walls 108b of the contact trench 108 to increase the impurity concentration of the corner portions 103a of the p-type base region 103. However, from the side walls 108b of the contact trench 108, this ion implantation reaches a formation region 103b of a channel (an n-type inversion layer formed when the SiC-MOSFET is in the ON state) near side walls 105b of the gate trench 105 and may cause increases in the gate threshold voltage or channel resistance.

The semiconductor device and the method of manufacturing a semiconductor device according to the present invention achieve effects in that punch-through may be prevented and the contact resistance may be reduced.

As described, the semiconductor device and the method of manufacturing a semiconductor device according to the present invention are useful for power semiconductor devices used in power converting equipment and power supply devices such as in various industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device comprising:
    a first semiconductor layer of a first conductivity type on a front surface of a semiconductor substrate of the first conductivity type, an impurity concentration of the first semiconductor layer being lower than that of the semiconductor substrate;
    a first trench provided in the first semiconductor layer;
    a gate electrode provided in the first trench via a gate insulating film covering sides of the first trench;
    a second semiconductor layer of the first conductivity type located across the gate insulating film from the gate electrode;
    a first semiconductor region of a second conductivity type located between the first semiconductor layer and the second semiconductor layer, the first semiconductor region located across the gate insulating film from the gate electrode;
    a second trench provided between the first trench and an adjacent first trench;
    a second semiconductor region of the second conductivity type located along side walls of the second trench and in contact with the first semiconductor region;
    a third semiconductor region of the second conductivity type located at a position corresponding to a bottom corner portion of the second trench and separated from the bottom corner portion of the second trench;
    a fourth semiconductor region of the second conductivity type located along a bottom of the second trench, at least a portion of the fourth semiconductor region exposed at a bottom of the second trench;
    a fifth semiconductor region of the second conductivity type located along the bottom of the second trench and having a depth deeper than the fourth semiconductor region, the fifth semiconductor region being in contact with the second semiconductor region and the fourth semiconductor region;
    a first electrode embedded in the second trench; and
    a second electrode on a rear surface of the semiconductor substrate, wherein
    an impurity concentration of the third semiconductor region is higher than an impurity concentration of the fifth semiconductor region, and
    the third semiconductor region is located within the fifth semiconductor region.

2. The semiconductor device according to claim 1, wherein
    an impurity concentration of the first semiconductor region is a same as an impurity concentration of the fourth semiconductor region.

3. The semiconductor device according to claim 1, wherein the first semiconductor layer includes:
    a third semiconductor layer of the first conductivity type on the front surface of the semiconductor substrate, an impurity concentration of the third semiconductor layer being lower than that of the semiconductor substrate, and
    a fourth semiconductor layer of the first conductivity type on a front surface of the third semiconductor layer opposite a rear surface of the third semiconductor layer facing the semiconductor substrate, an impurity concentration of the fourth semiconductor layer being higher than that of the third semiconductor layer, and
    wherein the fourth semiconductor region is provided at a depth not reaching an interface of the third semiconductor layer and the fourth semiconductor layer from the bottom of the second trench.

4. The semiconductor device according to claim 1, wherein an impurity concentration of the first semiconductor region is a same as an impurity concentration of the second semiconductor region.

5. The semiconductor device according to claim 1, wherein
the semiconductor substrate is a silicon carbide substrate.

6. A semiconductor device comprising:
a first semiconductor layer of a first conductivity type on a front surface of a semiconductor substrate of the first conductivity type, an impurity concentration of the first semiconductor layer being lower than that of the semiconductor substrate;
a first trench provided in the first semiconductor layer;
a gate electrode provided in the first trench via a gate insulating film covering sides of the first trench;
a second semiconductor layer of the first conductivity type located across the gate insulating film;
a first semiconductor region of a second conductivity type between the first semiconductor layer and the second semiconductor layer, the first semiconductor region located across the gate insulating film from the gate electrode;
a second trench provided between the first trench and an adjacent first trench;
a second semiconductor region of the second conductivity type located along side walls of the second trench and in contact with the first semiconductor region;
a third semiconductor region of the second conductivity type located at a bottom corner portion of the second trench and exposed at the bottom corner portion of the second trench, the third semiconductor region in contact with the second semiconductor region;
a fourth semiconductor region of the second conductivity type along a bottom of the second trench and exposed at the bottom of second trench, the fourth semiconductor region in contact with the third semiconductor region;
a fifth semiconductor region of the second conductivity type located along the bottom of the second trench and at a depth deeper than the fourth semiconductor region, the fifth semiconductor region in contact with the second semiconductor region, the third semiconductor region and the fourth semiconductor region;
a first electrode embedded in the second trench; and
a second electrode provided on a rear surface of the semiconductor substrate.

7. The semiconductor device according to claim 6, wherein
an impurity concentration of the first semiconductor region is the same as an impurity concentration of the fourth semiconductor region.

8. The semiconductor device according to claim 6, wherein the first semiconductor layer includes:
a third semiconductor layer of the first conductivity type provided on the front surface of the semiconductor substrate, an impurity concentration of the third semiconductor layer being lower than that of the semiconductor substrate, and
a fourth semiconductor layer of the first conductivity type provided on a front surface of the third semiconductor layer opposite a rear surface of the third semiconductor layer facing the semiconductor substrate, an impurity concentration of the fourth semiconductor layer being higher than that of the third semiconductor layer, and
the fourth semiconductor region is provided at a depth not reaching an interface of the third semiconductor layer and the fourth semiconductor layer from the bottom of the second trench.

9. The semiconductor device according to claim 6, wherein
an impurity concentration of the first semiconductor region is the same as an impurity concentration of the second semiconductor region.

10. The semiconductor device according to claim 6, wherein
the semiconductor substrate is a silicon carbide substrate.

* * * * *